(12) United States Patent
Lee (10) Patent No.: US 11,967,961 B2
(45) Date of Patent: Apr. 23, 2024

(54) CLOCK GENERATION CIRCUIT AND VOLTAGE GENERATION CIRCUIT INCLUDING THE CLOCK GENERATION CIRCUIT

(71) Applicant: SK hynix Inc., Icheon-si (KR)

(72) Inventor: Hyun Chul Lee, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 181 days.

(21) Appl. No.: 17/308,514

(22) Filed: May 5, 2021

(65) Prior Publication Data
US 2022/0231692 A1 Jul. 21, 2022

(30) Foreign Application Priority Data
Jan. 18, 2021 (KR) .................. 10-2021-0006849

(51) Int. Cl.
*H03L 7/089* (2006.01)
(52) U.S. Cl.
CPC .................. *H03L 7/0891* (2013.01)
(58) Field of Classification Search
CPC ......... H04L 7/02; H04L 7/027; H04L 7/0272; H04L 7/0274; H04L 7/0276; H04L 7/0278; H04L 7/033; H04L 7/0331; H04L 7/0332; H04L 7/0337; H04L 7/0338; H04L 7/04; H04L 7/041; H04L 7/042; H04L 7/043; H04L 7/044; H04L 2007/045; H04L 7/046; H04L 2007/047; H04L 7/06; H04L 7/065; H04L 7/08; H04L 7/10
See application file for complete search history.

(56) References Cited

U.S. PATENT DOCUMENTS 10,305,495 B2 * 5/2019 Behel .................. H03L 7/06

FOREIGN PATENT DOCUMENTS

KR 101685630 B1 12/2016
KR 1020190032651 A 3/2019

* cited by examiner

*Primary Examiner* — Diana J. Cheng
(74) *Attorney, Agent, or Firm* — WILLIAM PARK & ASSOCIATES LTD.

(57) ABSTRACT

A clock generation circuit includes a control clock generation circuit and first and second clock synchronization circuits. The control clock generation circuit compares a reference voltage with first and second feedback clock signals to generate first and second control clock signals. The first clock synchronization circuit makes the first and second feedback clock signals transit in synchronization with the first and second control clock signals. The second clock synchronization circuit generates first and second phase clock signals in synchronization with the first feedback clock signal and the second feedback clock signal.

5 Claims, 10 Drawing Sheets

CLOCK GENERATION CIRCUIT AND VOLTAGE GENERATION CIRCUIT INCLUDING THE CLOCK GENERATION CIRCUIT

CROSS-REFERENCES TO RELATED APPLICATION

The present application claims priority under 35 U.S.C. § 119(a) to Korean application number 10-2021-0006849, filed on Jan. 18, 2021, in the Korean Intellectual Property Office, which is incorporated herein by reference in its entirety as set forth in full.

BACKGROUND

1. Technical Field

Various embodiments generally relate to a clock generation circuit and a voltage generation circuit including the same, and, more particularly, to a clock generation circuit configured to generate multi-phase clock signals having different phases and a voltage generation circuit including the clock generation circuit.

2. Related Art

In general, an integrated circuit such as a semiconductor apparatus and a semiconductor memory apparatus performs predetermined operations based on a clock signal. Therefore, the integrated circuit is provided with a clock generation circuit configured to generate the clock signal. According to the use of clock signals, the clock generation circuit generates the clock signals of various types. Multi-phase clock signals are an example of the clock signals of various types. The multi-phase clock signals mean a plurality of phase clock signals having different phases from each other.

The clock generation circuit configured to generate the multi-phase clock signals may be implemented generally by a ring oscillator including a plurality of inverting gates. The plurality of inverting gates generate the multi-phase clock signals by inverting and delaying a signal. However, variation of PVT (Process, Voltage, Temperature) has a great influence on the plurality of inverting gates having a chain coupling structure. Therefore, intended duty ratios and transition time points of the multi-phase clock signals, to which the variation of PVT is reflected, cannot be guaranteed.

SUMMARY

In accordance with an embodiment of the present disclosure, a clock generation circuit may include a control clock generation circuit, a first clock synchronization circuit and a second clock synchronization circuit. The control clock generation circuit may compare a reference voltage with each of a first feedback clock signal and a second feedback clock signal to generate a first control clock signal and a second control clock signal. The first clock synchronization circuit may make the first feedback clock signal and the second feedback clock signal transit in synchronization with the first control clock signal and the second control clock signal. The second clock synchronization circuit may generate a first phase clock signal and a second phase clock signal in synchronization with a time point when each of the first feedback clock signal and the second feedback clock signal transitions.

In accordance with an embodiment of the present disclosure, a voltage generation circuit may include a clock generation circuit and a pumping circuit. The clock generation circuit may include a control clock generation circuit, a first clock synchronization circuit and a second clock synchronization circuit. The control clock generation circuit may compare a reference voltage with each of a first feedback clock signal and a second feedback clock signal to generate a first control clock signal and a second control clock signal. The first clock synchronization circuit may make the first feedback clock signal and the second feedback clock signal transit in synchronization with the first control clock signal and the second control clock signal. The second clock synchronization circuit may generate a first phase clock signal and a second phase clock signal in synchronization with a time point when each of the first feedback clock signal and the second feedback clock signal transitions. The pumping circuit may generate a pumped voltage through a pumping operation based on the first phase clock signal and the second phase clock signal.

In accordance with an embodiment of the present disclosure, a clock generation circuit may include an initialization control circuit, a first clock generation circuit and a second clock generation circuit. The initialization control circuit may generate first initialization signals and second initialization signals, which transition at different time points, based on a control pulse signal. The first clock generation circuit may generate a first phase clock signal and a second phase clock signal having different phases from each other through a synchronization operation based on the first initialization signals. The second clock generation circuit may generate a third phase clock signal and a fourth phase clock signal having different phases from each other through a synchronization operation based on the second initialization signals.

DETAILED DESCRIPTION

The description of the present disclosure is merely an embodiment for a structural and/or functional description. The scope of rights of the present disclosure should not be construed as being limited to embodiments described in the specification. That is, the scope of rights of the present disclosure should be understood as including equivalents, which may realize the technical spirit, because an embodiment may be modified in various ways and may have various forms. Furthermore, objects or effects proposed in the present disclosure do not mean that a specific embodiment should include all objects or effects or include only such effects. Accordingly, the scope of rights of the present disclosure should not be understood as being limited thereby.

The meaning of the terms that are described in this application should be understood as follows.

The terms, such as the "first" and the "second," are used to distinguish one element from another element, and the scope of the present disclosure should not be limited by the terms. For example, a first element may be named a second element. Likewise, the second element may be named the first element.

An expression of the singular number should be understood as including plural expressions, unless clearly expressed otherwise in the context. The terms, such as "include" or "have," should be understood as indicating the existence of a set characteristic, number, step, operation, element, part, or a combination thereof, not excluding a possibility of the existence or addition of one or more other characteristics, numbers, steps, operations, elements, parts, or a combination thereof.

In each of steps, symbols (e.g., a, b, and c) are used for convenience of description, and the symbols do not describe order of the steps. The steps may be performed in order different from order described in the context unless specific order is clearly described in the context. That is, the steps may be performed according to described order, may be performed substantially at the same time as the described order, or may be performed in reverse order of the described order.

All the terms used herein, including technological or scientific terms, have the same meanings as those that are typically understood by those skilled in the art, unless otherwise defined. Terms defined in commonly used dictionaries should be construed as with the same meanings as those in the context in related technology and should not be construed as with ideal or excessively formal meanings, unless clearly defined in the application.

In accordance with an embodiment of the present disclosure, a clock generation circuit may generate multi-phase clock signals through a synchronization structure of a plurality of inverting gates rather than a chain structure thereof.

In accordance with an embodiment of the present disclosure, a voltage generation circuit may generate a voltage by utilizing multi-phase clock signals generated from a clock generation circuit.

Figure 1:
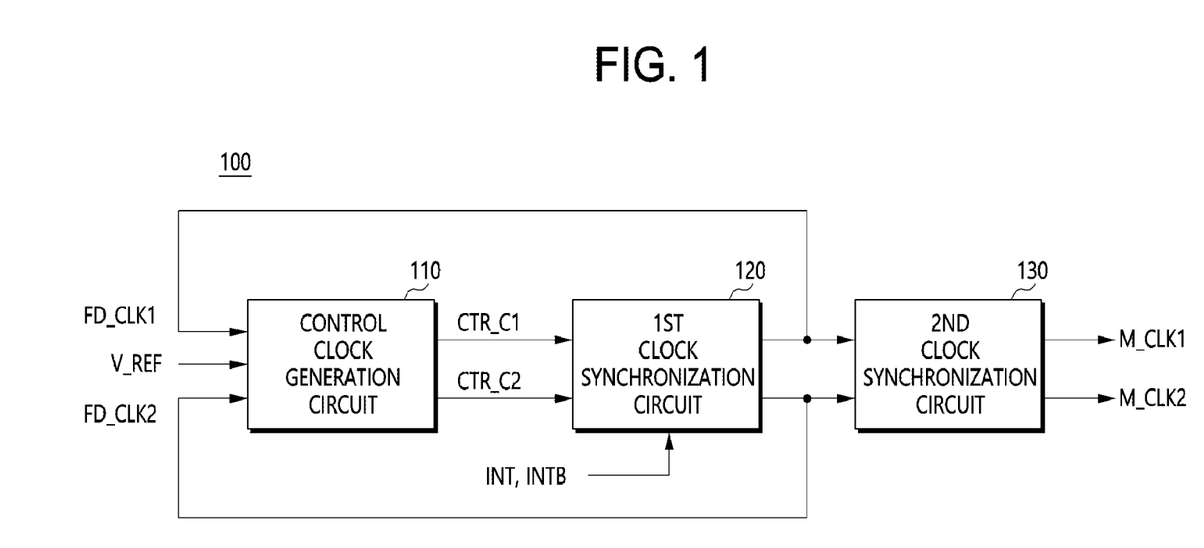
FIG. 1 is a block diagram illustrating a configuration of a clock generation circuit in accordance with an embodiment of the present disclosure.

FIG. 1 is a block diagram illustrating a configuration of a clock generation circuit 100 in accordance with an embodiment.

Referring to FIG. 1, the clock generation circuit 100 may include a control clock generation circuit 110, a first clock synchronization circuit 120 and a second clock synchronization circuit 130.

The control clock generation circuit 110 may compare a reference voltage V_REF with each of a first feedback clock signal FD_CLK1 and a second feedback clock signal FD_CLK2 to generate a first control clock signal CTR_C1 and a second control clock signal CTR_C2. The first feedback clock signal FD_CLK1 and the second feedback clock signal FD_CLK2 may be output from the first clock synchronization circuit 120, which will be described later. The second clock synchronization circuit 130 may generate a first phase clock signal M_CLK1 and a second phase clock signal M_CLK2 in synchronization with a time point when each of the first feedback clock signal FD_CLK1 and the second feedback clock signal FD_CLK2 transition.

Figure 2:
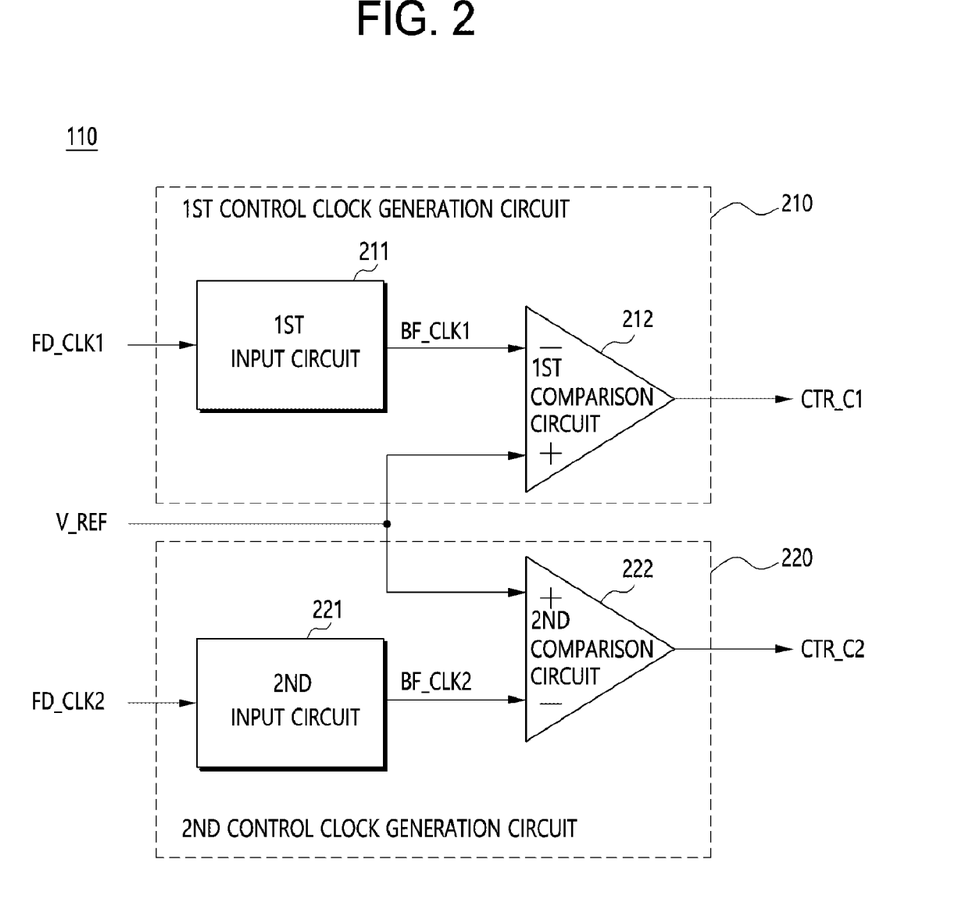
FIG. 2 is a block diagram illustrating a configuration of a control clock generation circuit illustrated in FIG. 1.

FIG. 2 is a block diagram illustrating a configuration of the control clock generation circuit 110 illustrated in FIG. 1.

Referring to FIG. 2, the control clock generation circuit 110 may include a first control clock generation circuit 210 and a second control clock generation circuit 220.

The first control clock generation circuit 210 may compare voltage levels of the first feedback clock signal FD_CLK1 and the reference voltage V_REF to generate the first control clock signal CTR_C1. The first control clock generation circuit 210 may include a first input circuit 211 and a first comparison circuit 212.

The first input circuit 211 may receive, buffer and output the first feedback clock signal FD_CLK1. The first comparison circuit 212 may compare voltage levels of the reference voltage V_REF and an output signal BF_CLK1 of the first input circuit 211 to output the first control clock signal CTR_C1, may receive the output signal BF_CLK1 of the first input circuit 211 through its negative (−) node, and may receive the reference voltage V_REF through its positive (+) node.

The second control clock generation circuit 220 may compare voltage levels of the second feedback clock signal FD_CLK2 and the reference voltage V_REF to generate the second control clock signal CTR_C2. The second control clock generation circuit 220 may include a second input circuit 221 and a second comparison circuit 222.

The second input circuit 221 may receive, buffer and output the second feedback clock signal FD_CLK2. The second comparison circuit 222 may compare voltage levels of the reference voltage V_REF and an output signal BF_CLK2 of the second input circuit 221 to output the second control clock signal CTR_C2, may receive the output signal BF_CLK2 of the second input circuit 221 through its negative (−) node, and may receive the reference voltage V_REF through its positive (+) node.

The first input circuit 211 and the second input circuit 221 may have a similar circuit configuration to each other. Hereinafter, representatively described in detail will be a circuit configuration of the first input circuit 211 for the convenience of description.

Figure 3:
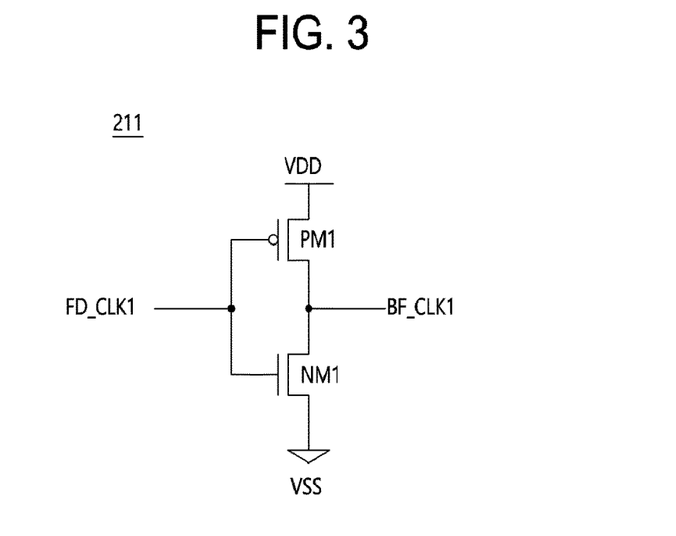
FIG. 3 is a circuit diagram illustrating a circuit configuration of a first input circuit illustrated in FIG. 2.

FIG. 3 is a circuit diagram illustrating a circuit configuration of the first input circuit 211 illustrated in FIG. 2.

Referring to FIG. 3, the first input circuit 211 may include a first PMOS transistor PM1 and a first NMOS transistor NM1.

The first PMOS transistor PM1 and the first NMOS transistor NM1 may be serially coupled between the power voltage node VDD and the ground voltage node VSS. Gates of the first PMOS transistor PM1 and the first NMOS transistor NM1 may be commonly coupled to an input node, wherein through the input node, the first PMOS transistor PM1 and the first NMOS transistor NM1 may receive the first feedback clock signal FD_CLK1. Drains of the first PMOS transistor PM1 and the first NMOS transistor NM1 may be commonly coupled to an output node. A first buffered clock signal BF_CLK1, i.e., the output signal BF_CLK1 of the first input circuit 211 may be output through the output node.

Through such configuration described above, the first input circuit 211 may receive and buffer the first feedback clock signal FD_CLK1 to output the first feedback clock signal FD_CLK1 as the first buffered clock signal BF_CLK1.

Referring back to FIG. 2, the second input circuit 221 may have the same configuration as the first input circuit 211 illustrated in FIG. 3. However, the second input circuit 221 may receive the second feedback clock signal FD_CLK2 instead of the first feedback clock signal FD_CLK1. Therefore, the second input circuit 221 may receive and buffer the second feedback clock signal FD_CLK2 to output the second feedback clock signal FD_CLK2 as a second buffered clock signal BF_CLK2, i.e., the output signal BF_CLK2 of the second input circuit 221.

The first comparison circuit 212 and the second comparison circuit 222 may have a similar circuit configuration to each other. Hereinafter, representatively described in detail will be a circuit configuration of the first comparison circuit 212 for the convenience of description.

Figure 4:
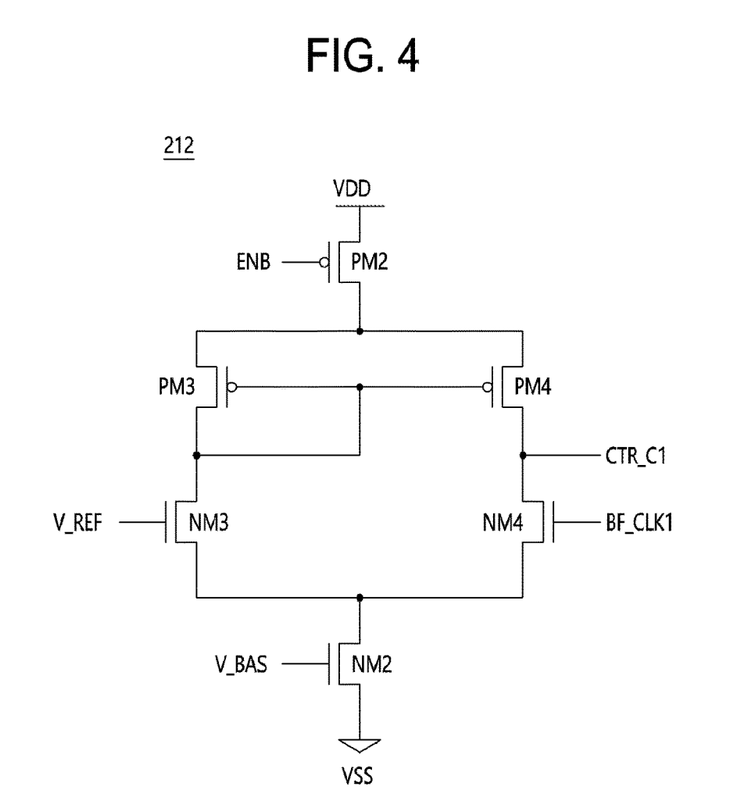
FIG. 4 is a circuit diagram illustrating a circuit configuration of a first comparison circuit illustrated in FIG. 2.

FIG. 4 is a circuit diagram illustrating a circuit configuration of the first comparison circuit 212 illustrated in FIG. 2.

Referring to FIG. 4, the first comparison circuit 212 may include second to fourth PMOS transistors PM2, PM3 and PM4 and second to fourth NMOS transistors NM2, NM3 and NM4.

The second PMOS transistor PM2 may be coupled to the power voltage node VDD at its source and may receive an enable signal ENB at its gate. The enable signal ENB may be a signal for controlling an activation operation of the first comparison circuit 212. The second NMOS transistor NM2 may be coupled to the ground voltage node VSS at its source and may receive a bias voltage V_BAS at its gate. The bias voltage V_BAS may be a voltage applied in order to utilize the second NMOS transistor NM2 as a current source.

Between the second PMOS transistor PM2 and the second NMOS transistor NM2, the third PMOS transistor PM3 and the third NMOS transistor NM3 may be serially coupled and the fourth PMOS transistor PM4 and the fourth NMOS transistor NM4 may be serially coupled. Gates of the third PMOS transistor PM3 and the fourth PMOS transistor PM4 may be commonly coupled to a common node, to which a drain of the third NMOS transistor NM3 may be coupled. The third NMOS transistor NM3 may receive the reference voltage V_REF at its gate. The fourth NMOS transistor NM4 may receive the first buffered clock signal BF_CLK1 at its gate. The fourth PMOS transistor PM4 and the fourth NMOS transistor NM4 may be commonly coupled to an output node. The first control clock signal CTR_C1 may be output through the output node.

Through such configuration described above, the first comparison circuit 212 may compare the voltage levels of the reference voltage V_REF and the first buffered clock signal BF_CLK1, i.e., the output signal BF_CLK1 of the first input circuit 211 illustrated in FIG. 2 to output the first control clock signal CTR_C1.

Referring back to FIG. 2, the second comparison circuit 222 may have the same configuration as the first comparison circuit 212 illustrated in FIG. 4. However, the second comparison circuit 222 may receive the second buffered clock signal BF_CLK2, instead of the first buffered clock signal BF_CLK1, to output the second control clock signal CTR_C2.

Referring back to FIG. 1, the first clock synchronization circuit 120 may be configured to make the first feedback clock signal FD_CLK1 and the second feedback clock signal FD_CLK2 transit in synchronization with the first control clock signal CTR_C1 and the second control clock signal CTR_C2. The first feedback clock signal FD_CLK1 generated by the first clock synchronization circuit 120 may be fed back to the first input circuit 211 illustrated in FIG. 2 and the second feedback clock signal FD_CLK2 generated by the first clock synchronization circuit 120 may be fed back to the second input circuit 221 illustrated in FIG. 2. As described later in detail, the first clock synchronization circuit 120 may perform an initialization operation based on initialization signals INT and INTB.

Figure 5:
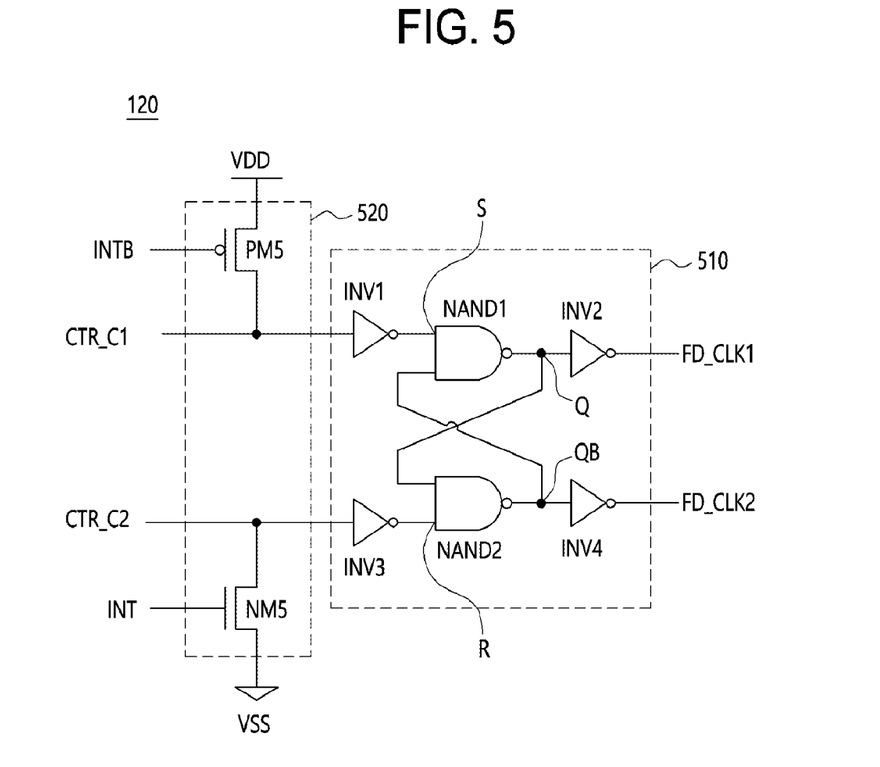
FIG. 5 is a circuit diagram illustrating a circuit configuration of a first clock synchronization circuit illustrated in FIG. 1.

FIG. 5 is a circuit diagram illustrating a circuit configuration of the first clock synchronization circuit 120 illustrated in FIG. 1.

Referring to FIG. 5, the first clock synchronization circuit 120 may include a latching circuit 510 and an initialization circuit 520.

The latching circuit 510 may perform a set operation based on the first control clock signal CTR_C1 and may perform a reset operation based on the second control clock signal CTR_C2. For example, the latching circuit 510 may be implemented by a SR latch. The latching circuit 510 may include first to fourth inverting gates INV1, INV2, INV3 and INV4 and first and second NAND gates NAND1 and NAND2.

In an embodiment, the latching circuit 510 may be configured to have a substantially constant duty ratio, and the second clock synchronization circuit 130 may include first and second toggle flip-flops to generate the first phase clock signal M_CLK1 and the second phase clock signal M_CLK2, respectively, such that there is a substantially constant delay phase difference of 90 degrees between the first phase clock signal M_CLK1 and the second phase clock signal M_CLK2.

As illustrated in FIG. 5, the first inverting gate INV1 may receive and invert the first control clock signal CTR_C1 and may output the inverted signal. The first NAND gate NAND1 may perform a NAND operation on the output signal of the first inverting gate INV1 and an output signal of the second NAND gate NAND2, which will be described later, to output a result of the NAND operation. The second inverting gate INV2 may receive and invert the output signal of the first NAND gate NAND1 to output the first feedback clock signal FD_CLK1. The third inverting gate INV3 may receive and invert the second control clock signal CTR_C2 and output the inverted signal. The second NAND gate NAND2 may perform a NAND operation on the output signal of the first NAND gate NAND1 and the output signal of the third inverting gate INV3 to output a result of the NAND operation. The fourth inverting gate INV4 may receive and invert the output signal of the second NAND gate NAND2 to output the second feedback clock signal FD_CLK2.

Through such configuration described above, as shown in FIG. 5, the latching circuit 510 may generate the first feedback clock signal FD_CLK1 and the second feedback clock signal FD_CLK2. When the first control clock signal CTR_C1 has a level of logic high, the first feedback clock signal FD_CLK1 may transit to a level of logic low and the second feedback clock signal FD_CLK2 may transit to a level of logic high, through the set operation. When the second control clock signal CTR_C2 has a level of logic high, the first feedback clock signal FD_CLK1 may transit to a level of logic high and the second feedback clock signal FD_CLK2 may transit to a level of logic low, through the reset operation.

As shown in FIG. 5, the initialization circuit 520 may initialize the latching circuit 510 based on the initialization signals INT and INTB, wherein the initialization signals INT and INTB may include a positive initialization signal INT and a negative initialization signal INTB. The positive initialization signal INT and the negative initialization signal INTB may have opposite phases to each other. The initialization circuit 520 may include a fifth PMOS transistor PM5 and a fifth NMOS transistor NM5.

The fifth PMOS transistor PM5 may be coupled between the power voltage node VDD and the input node of the first control clock signal CTR_C1 through its source and drains, and may receive the negative initialization signal INTB through its gate. The fifth NMOS transistor NM5 may be coupled between the input node of the second control clock signal CTR_C2 and the ground voltage node VSS through its drain and source, and may receive the positive initialization signal INT through its gate.

Through such configuration described above, the initialization circuit 520 may perform the initialization operation while the negative initialization signal INTB has a level of logic low and the positive initialization signal INT has a level of logic high. During the initialization operation, the fifth PMOS transistor PM5 may be turned on and may keep the first control clock signal CTR_C1 to a level of logic high and the fifth NMOS transistor NM5 may be turned on and may keep the second control clock signal CTR_C2 to a level of logic low. That is, the initialization circuit 520 may set the first control clock signal CTR_C1 and the second control clock signal CTR_C2 to predetermined logic levels through the initialization operation.

In accordance with an embodiment, the clock generation circuit 100 may generate the multi-phase clock signals through an oscillation operation after the initialization operation. That is, after the initialization operation, the clock generation circuit 100 may start performing the oscillation operation when the negative initialization signal INTB has a level of logic high and the positive initialization signal INT has a level of logic low. At this time, the fifth PMOS transistor PM5 and the fifth NMOS transistor NM5 of the initialization circuit 520 may be turned off so that through the oscillation operation based on the positive initialization signal INT and the negative initialization signal INTB, the clock generation circuit 100 may generate, as the multi-phase clock signals, a first phase clock signal M_CLK1 and a second phase clock signal M_CLK2.

Referring back to FIG. 1, the second clock synchronization circuit 130 may generate the first phase clock signal M_CLK1 and the second phase clock signal M_CLK2 in synchronization with a time point when each of the first feedback clock signal FD_CLK1 and the second feedback clock signal FD_CLK2 transitions. The first phase clock signal M_CLK1 and the second phase clock signal M_CLK2 may have a phase difference corresponding to an amount of 90 degrees.

Figure 6:
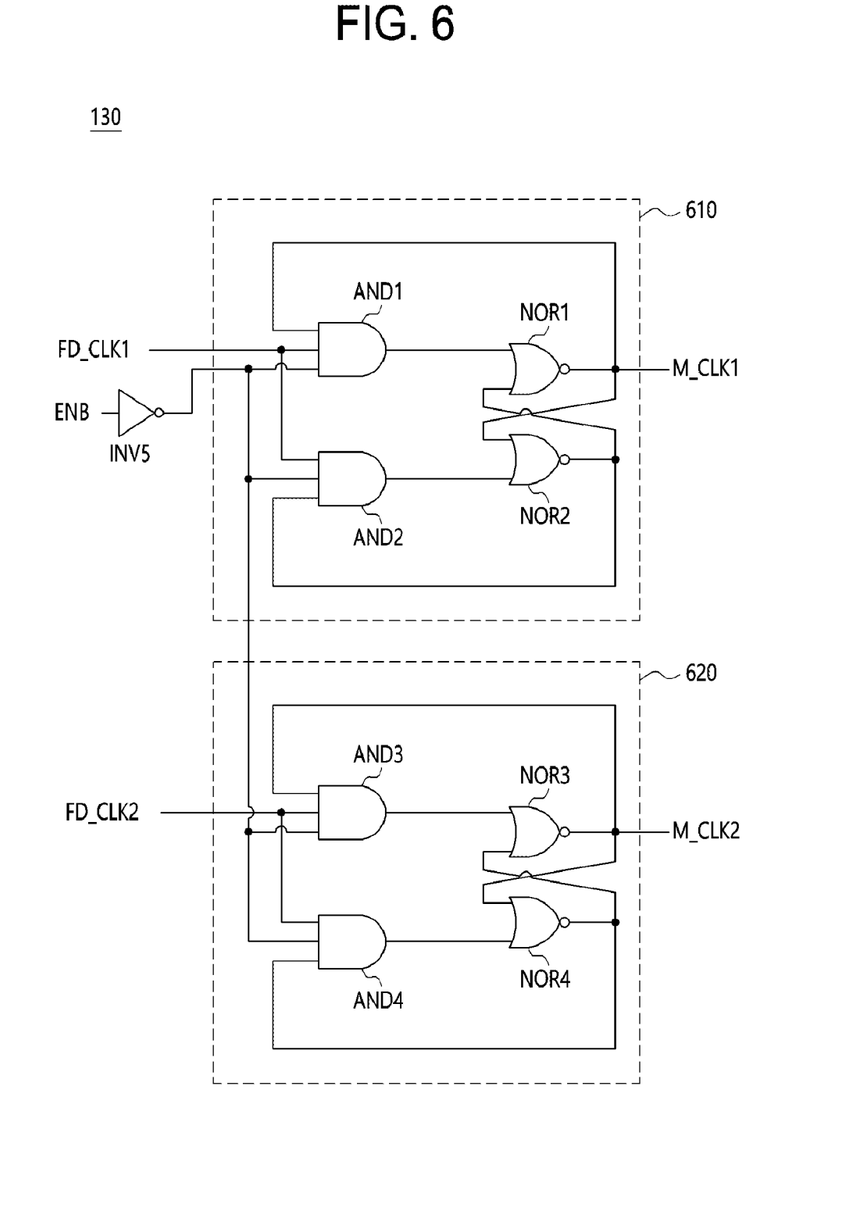
FIG. 6 is a circuit diagram illustrating a circuit configuration of a second clock synchronization circuit illustrated in FIG. 1.

FIG. 6 is a circuit diagram illustrating a circuit configuration of the second clock synchronization circuit 130 illustrated in FIG. 1.

Referring to FIG. 6, the second clock synchronization circuit 130 may include a first dividing circuit 610 and a second dividing circuit 620.

The first dividing circuit 610 may be configured to receive and divide the first feedback clock signal FD_CLK1 to generate the first phase clock signal M_CLK1. The first dividing circuit 610 may be implemented by a T flip-flop. The first dividing circuit 610 may include first and second AND gates AND1 and AND2 and first and second NOR gates NOR1 and NOR2.

As shown in FIG. 6, the first AND gate AND1 may receive and perform an AND operation on the first phase clock signal M_CLK1 and the first feedback clock signal FD_CLK1 to output a result of the AND operation. The second AND gate AND2 may receive and perform an AND operation on the first feedback clock signal FD_CLK1 and an output signal of the second NOR gate NOR2 to output a result of the AND operation. The first NOR gate NOR1 may receive and perform a NOR operation on the output signal of the first AND gate AND1 and the output signal of the second NOR gate NOR2 to output a result of the NOR operation. The second NOR gate NOR2 may receive and perform a NOR operation on the output signal of the first NOR gate NOR1 and the output signal of the second AND gate AND2 to output a result of the NOR operation.

The second dividing circuit 620 may be configured to receive and divide the second feedback clock signal FD_CLK2 to generate the second phase clock signal M_CLK2. The second dividing circuit 620 may be implemented by a toggle flip-flop(TFF). The second dividing circuit 620 may include third and fourth AND gates AND3 and AND4 and third and fourth NOR gates NOR3 and NOR4.

The third AND gate AND3 may receive and perform an AND operation on the second phase clock signal M_CLK2 and the second feedback clock signal FD_CLK2 to output a result of the AND operation. The fourth AND gate AND4 may receive and perform an AND operation on the second feedback clock signal FD_CLK2 and an output signal of the fourth NOR gate NOR4 to output a result of the AND operation. The third NOR gate NOR3 may receive and perform a NOR operation on the output signal of the third AND gate AND3 and the output signal of the fourth NOR gate NOR4 to output a result of the NOR operation. The fourth NOR gate NOR4 may receive and perform a NOR operation on the output signal of the third NOR gate NOR3 and the output signal of the fourth AND gate AND4 to output a result of the NOR operation.

The first to fourth AND gates AND1, AND2, AND3 and AND4 may receive an output signal of a fifth inverting gate INV5. The fifth inverting gate INV5 may invert the enable signal ENB and output the inverted signal, wherein the enable signal ENB may be the one described with reference to FIG. 4. Therefore, while the first comparison circuit 212 illustrated in FIG. 4 performs the comparison operation based on the enable signal ENB, the first driving circuit 610 and the second dividing circuit 620 illustrated in FIG. 6 may perform the dividing operation based on the enable signal ENB.

Through such configuration described above, the second clock synchronization circuit 130 may generate the first phase clock signal M_CLK1 and the second phase clock signal M_CLK2 in synchronization with the time point when each of the first feedback clock signal FD_CLK1 and the second feedback clock signal FD_CLK2 transitions, through the dividing operation.

Figure 7:
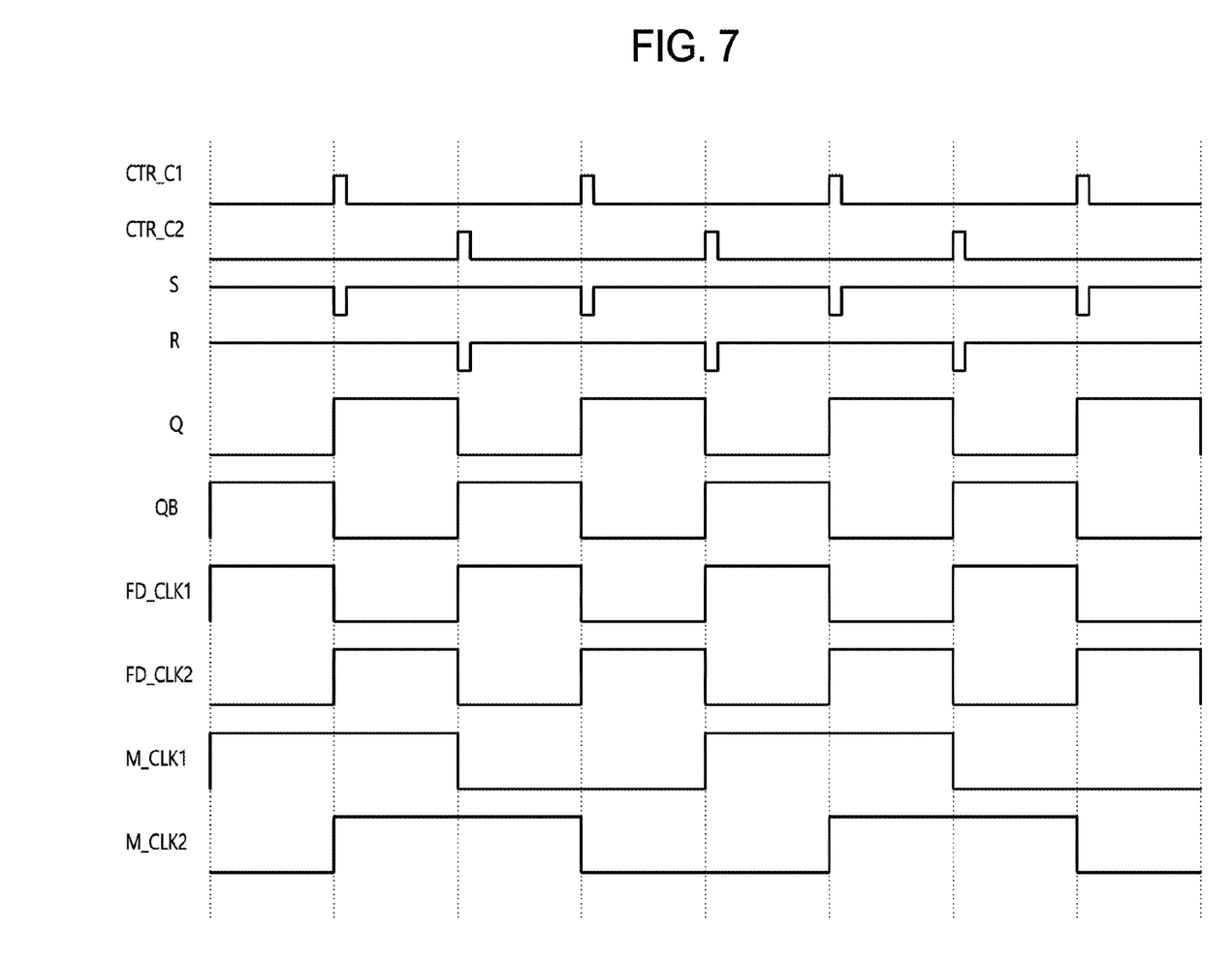
FIG. 7 is a waveform diagram illustrating an oscillation operation of the clock generation circuit illustrated in FIG. 1.

FIG. 7 is a waveform diagram illustrating the oscillation operation of the clock generation circuit 100 illustrated in FIG. 1. For the convenience of description, described will be the oscillation operation after the initialization operation. FIG. 7 illustrates the waveforms of the first control clock signal CTR_C1, the second control clock signal CTR_C2, the first input node S, the second input node R, the first output node Q, the second output node QB, the first feedback clock signal FD_CLK1, the second feedback clock signal FD_CLK2, the first phase clock signal M_CLK1 and the second phase clock signal M_CLK2, illustrated in FIG. 5.

The control clock generation circuit 110 illustrated in FIG. 1 may compare the first feedback clock signal FD_CLK1 with the reference voltage V_REF to generate the first control clock signal CTR_C1. The control clock generation circuit 110 may compare the second feedback clock signal FD_CLK2 with the reference voltage V_REF to generate the second control clock signal CTR_C2. Each of the first control clock signal CTR_C1 and the second control clock signal CTR_C2 may be output as a pulse signal based on the result of the comparison, wherein a pulse width of the pulse signal may vary according to a capacitance value reflected to each of the first control clock signal CTR_C1 and the second control clock signal CTR_C2 or according to the voltage level of the reference voltage V_REF.

In addition, the first clock synchronization circuit 120 illustrated in FIG. 1 may generate the first feedback clock signal FD_CLK1 and the second feedback clock signal FD_CLK2 in synchronization with the first control clock signal CTR_C1 and the second control clock signal CTR_C2. As described with reference to FIG. 5, the first inverting gate INV1 may invert the first control clock signal CTR_C1 to output the inverted signal to the first input node S and the third inverting gate INV3 may invert the second control clock signal CTR_C2 to output the inverted signal to the second input node R. Thus, the first output node Q may have a level of logic high when the first input node S has a level of logic low and may have a level of logic low when the second input node R has a level of logic low. The second output node QB may have an opposite level to the first output node Q. For example, the second inverting gate INV2 may invert the output signal of the first output node Q to generate the first feedback clock signal FD_CLK1. The fourth inverting gate INV4 may invert the output signal of the second output node QB to generate the second feedback clock signal FD_CLK2.

The second clock synchronization circuit 130 illustrated in FIG. 1 may generate the first phase clock signal M_CLK1 and the second phase clock signal M_CLK2 in synchronization with the time point when each of the first feedback clock signal FD_CLK1 and the second control clock signal CTR_C2 transitions. As described with reference to FIG. 6, the first dividing circuit 610 may divide the first feedback clock signal FD_CLK1 to generate the first phase clock signal M_CLK1 and the second dividing circuit 620 may divide the second feedback clock signal FD_CLK2 to generate the second phase clock signal M_CLK2. Therefore, as can be seen from FIG. 7, the first phase clock signal M_CLK1 and the second phase clock signal M_CLK2 may have a phase difference corresponding to an amount of 90 degrees.

In accordance with an embodiment, the clock generation circuit 100 may generate the multi-phase clock signals including the first phase clock signal M_CLK1 and the second phase clock signal M_CLK2 through the synchronization structure of the first clock synchronization circuit 120 and the second clock synchronization circuit 130.

Figure 8:
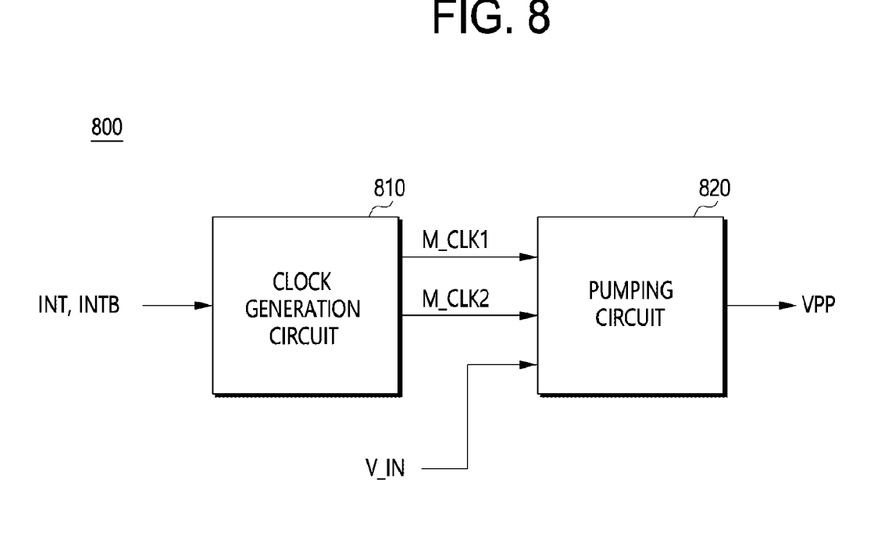
FIG. 8 is a block diagram illustrating a configuration of a voltage generation circuit in accordance with an embodiment of the present disclosure.

FIG. 8 is a block diagram illustrating a configuration of a voltage generation circuit 800 in accordance with an embodiment of the present disclosure.

Referring to FIG. 8, the voltage generation circuit 800 may include a clock generation circuit 810 and a pumping circuit 820.

The clock generation circuit 810 may be configured to generate, as the multi-phase clock signals, the first phase clock signal M_CLK1 and the second phase clock signal M_CLK2 through the synchronization operation based on the initialization signals INT and INTB. The clock generation circuit 810 may correspond to clock generation circuit 100 described with reference to FIGS. 1, 2, 3, 4, 5, 6, to 7. That is, the first phase clock signal M_CLK1 and the second phase clock signal M_CLK2, which are generated from the clock generation circuit 810 illustrated in FIG. 8, may have a phase difference corresponding to an amount of 90 degrees.

The pumping circuit 820 may generate a pumped voltage VPP through a pumping operation based on the first phase clock signal M_CLK1 and the second phase clock signal M_CLK2, wherein the pumping circuit 820 may receive an input voltage V_IN and may generate the pumped voltage VPP having a higher voltage level than the input voltage V_IN through the pumping operation.

Figure 9:
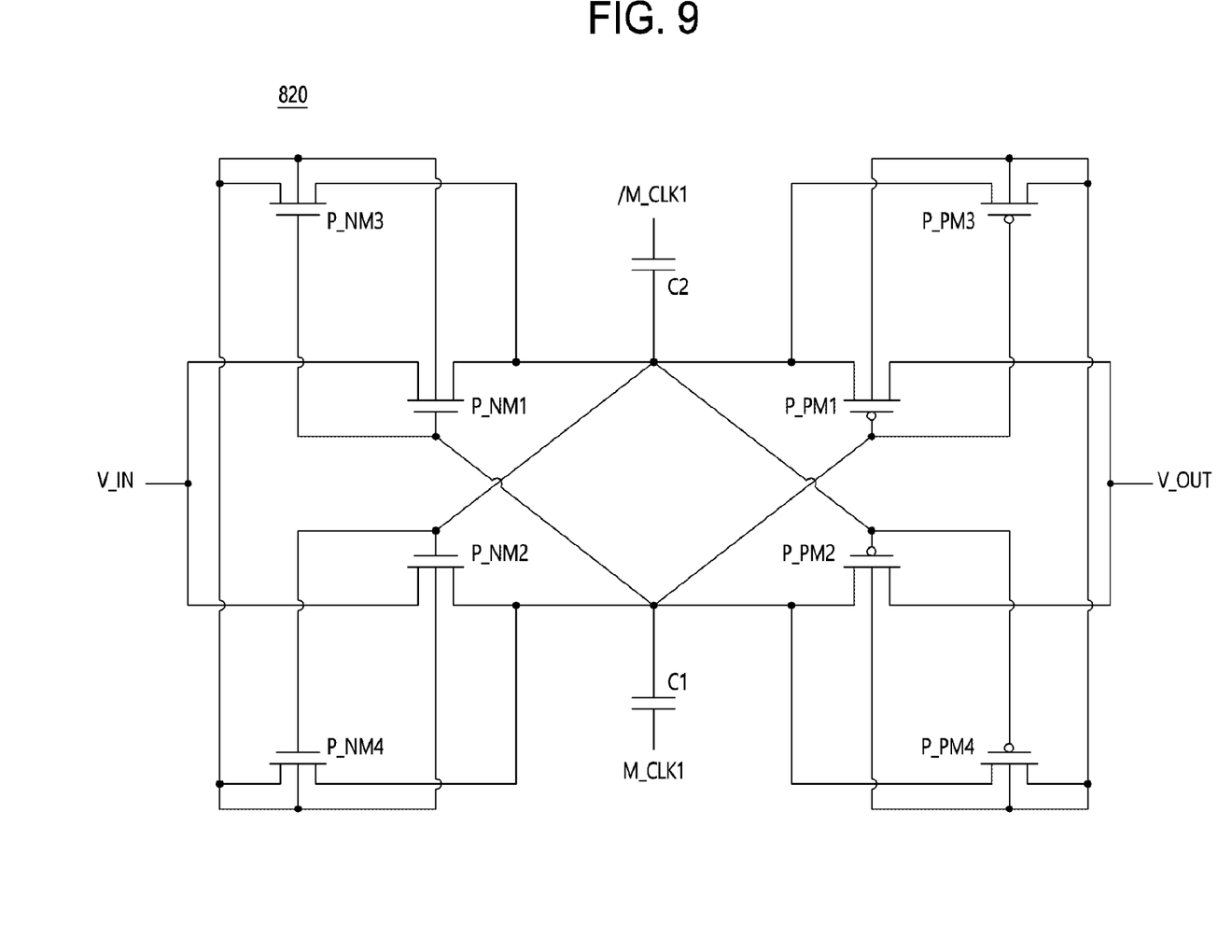
FIG. 9 is a circuit diagram illustrating a circuit configuration of a pumping circuit illustrated in FIG. 8.

FIG. 9 is a circuit diagram illustrating a circuit configuration of the pumping circuit 820 illustrated in FIG. 8. The pumping circuit 820 may include a plurality of unit pumping circuits each configured to perform a pumping operation based on a corresponding one of the first phase clock signal M_CLK1 and the second phase clock signal M_CLK2. Hereinafter, representatively described in detail with reference to FIG. 9 will be a circuit configuration of a unit pumping circuit configured to perform the pumping operation based on the first phase clock signal M_CLK1 for the convenience of description.

Referring to FIG. 9, the pumping circuit 820 may include a first capacitor C1, a second capacitor C2, first to fourth pumping NMOS transistors P_NM1, P_NM2, P_NM3 and P_NM4 and first to fourth pumping PMOS transistors P_PM1, P_PM2, P_PM3 and P_PM4.

The first capacitor C1 may receive a first positive phase clock signal M_CLK1 and the second capacitor C2 may receive a first negative phase clock signal/M_CLK1. The first positive phase clock signal M_CLK1 may be a clock signal corresponding to the first phase clock signal M_CLK1 and the first negative phase clock signal/M_CLK1 may be a clock signal inverted from the first phase clock signal M_CLK1.

The first capacitor C1 and the second capacitor C2 may be coupled to the plurality of transistors, i.e., the first to fourth pumping NMOS transistors P_NM1, P_NM2, P_NM3 and P_NM4 and the first to fourth pumping PMOS transistors P_PM1, P_PM2, P_PM3 and P_PM4. The first pumping NMOS transistor P_NM1, the second pumping NMOS transistor P_NM2, the first pumping PMOS transistor P_PM1 and the second pumping PMOS transistor P_PM2 may have the cross-coupled structure. The third pumping NMOS transistor P_NM3, the fourth pumping NMOS transistor P_NM4, the third pumping PMOS transistor P_PM3 and the fourth pumping PMOS transistor P_PM4 may have the cross-coupled structure.

Through such configuration described above, the pumping circuit 820 may generate an output voltage V_OUT having a higher voltage level than the input voltage V_IN through the pumping operation on the input voltage V_IN based on the first positive phase clock signal M_CLK1 and the first negative phase clock signal/M_CLK1 The output voltage V_OUT may be provided as an input voltage to the unit pumping circuit that performs the pumping operation based on the second phase clock signal M_CLK2. The unit pumping circuit may perform the pumping operation based on the second phase clock signal M_CLK2 and may generate the pumped voltage VPP having a higher voltage level than the input voltage through the pumping operation.

Figure 10:
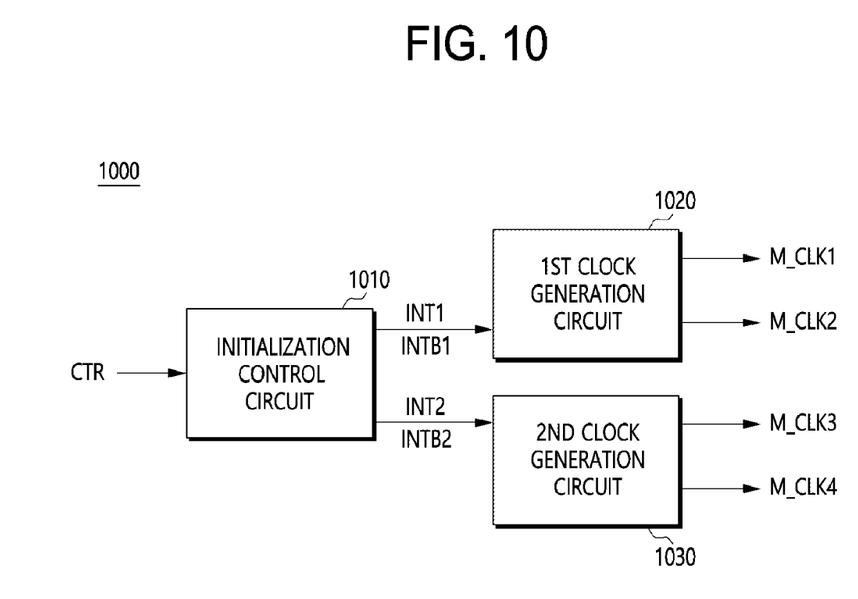
FIG. 10 is a block diagram illustrating a configuration of a clock generation circuit in accordance with an embodiment of the present disclosure.

FIG. 10 is a block diagram illustrating a configuration of a clock generation circuit 1000 in accordance with an embodiment.

Referring to FIG. 10, the clock generation circuit 1000 may generate first to fourth phase clock signals M_CLK1, M_CLK2, M_CLK3 and M_CLK4 through the synchronization operation. The first to fourth phase clock signals M_CLK1, M_CLK2, M_CLK3 and M_CLK4 may have different phases from each other. For example, the first phase clock signal M_CLK1 and the second phase clock signal M_CLK2 may have a phase difference corresponding to an amount of 90 degrees, the second phase clock signal M_CLK2 and the third phase clock signals M_CLK3 may have a phase difference corresponding to an amount of 90 degrees and the third phase clock signals M_CLK3 and the fourth phase clock signals M_CLK4 may have a phase difference corresponding to an amount of 90 degrees. The clock generation circuit 1000 may include an initialization control circuit 1010, a first clock generation circuit 1020 and a second clock generation circuit 1030.

The initialization control circuit 1010 may be configured to generate first initialization signals INT1 and INTB1 and second initialization signals INT2 and INTB2, which transition at different time points, based on a control pulse signal CTR.

The control pulse signal CTR may have information corresponding to a half period of a target phase clock signal. For example, the control pulse signal CTR may correspond to the first phase clock signal M_CLK1. The control pulse signal CTR may include a pulse corresponding to a half period of the first phase clock signal M_CLK1. Therefore, for example, the initialization control circuit 1010 may control the time point when the first initialization signals INT1 and INTB1 transition based on a rising edge of the pulse of the control pulse signal CTR and may control the time point when the second initialization signals INT2 and INTB2 transition based on a falling edge of the pulse of the control pulse signal CTR. Each pair of the first initialization signals INT1 and INTB1 and the second initialization signals INT2 and INTB2 may correspond to the pair of the initialization signals INT and INTB illustrated in FIG. 1.

The first clock generation circuit 1020 may generate the first phase clock signal M_CLK1 and the second phase clock signal M_CLK2 having different phases from each other through the synchronization operation based on the first initialization signals INT1 and INTB1. The first clock generation circuit 1020 may correspond to the clock generation circuit 100 described with reference to FIGS. 1 to 7. Therefore, the first clock generation circuit 1020 may generate the first phase clock signal M_CLK1 and the second phase clock signal M_CLK2 having a phase difference corresponding to an amount of 90 degrees based on the first initialization signals INT1 and INTB1.

The second clock generation circuit 1030 may generate the third phase clock signal M_CLK3 and the fourth phase clock signal M_CLK4 having different phases from each other through the synchronization operation based on the second initialization signals INT2 and INTB2. The second clock generation circuit 1030 may correspond to the clock generation circuit 100 described with reference to FIGS. 1 to 7. Therefore, the second clock generation circuit 1030 may generate the third phase clock signal M_CLK3 and the fourth phase clock signal M_CLK4 having a phase difference corresponding to an amount of 90 degrees based on the second initialization signals INT2 and INTB2.

As described above, the control pulse signal CTR may have information corresponding to the half period of the first phase clock signal M_CLK1. Therefore, the time point when the first initialization signals INT1 and INTB1 transition and the time point when the second initialization signals INT2 and INTB2 transition may have a phase difference corresponding to the half period of the first phase clock signal M_CLK1. That is, the time point when the first initialization signals INT1 and INTB1 transition and the time point when the second initialization signals INT2 and INTB2 transition may have a phase difference corresponding to an amount of 180 degrees with respect to the first phase clock signal M_CLK1.

Figure 11:
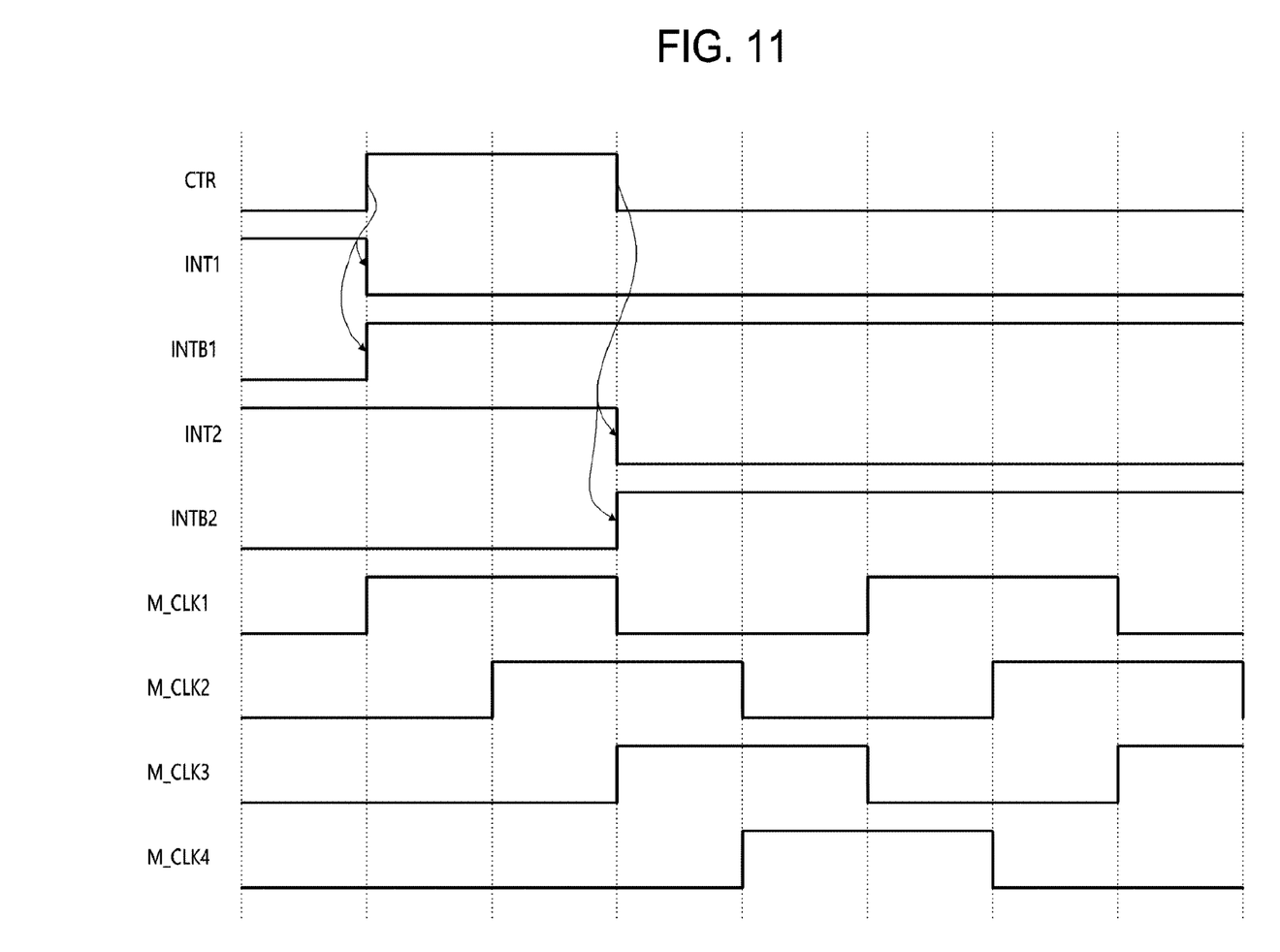
FIG. 11 is a waveform diagram illustrating an oscillation operation of the clock generation circuit illustrated in FIG. 10.

FIG. 11 is a waveform diagram illustrating an oscillation operation of the clock generation circuit 1000 illustrated in FIG. 10. FIG. 11 illustrates the waveforms of the control pulse signal CTR, the first initialization signals INT1 and INTB1, the second initialization signals INT2 and INTB2 and the first to fourth phase clock signals M_CLK1, M_CLK2, M_CLK3 and M_CLK4, which are illustrated in FIG. 10.

Referring to FIG. 11, the control pulse signal CTR may include the pulse that is information corresponding to the half period of the first phase clock signal M_CLK1. The initialization control circuit 1010 illustrated in FIG. 10 may generate the first initialization signals INT1 and INTB1 and the second initialization signals INT2 and INTB2, which transition at different time points, based on the control pulse signal CTR.

Referring back to FIG. 11, the first initialization signals INT1 and INTB1 may include a first positive initialization signal INT1 and a first negative initialization signal INTB1. Therefore, the first positive initialization signal INT1 and the first negative initialization signal INTB1 may transition based on the rising edge, at which the pulse of the control pulse signal CTR begins. That is, based on the rising edge of the control pulse signal CTR, the first positive initialization signal INT1 may transition from a level of logic high to a level of logic low and the first negative initialization signal INTB1 may transition from a level of logic low to a level of logic high. As described with reference to FIG. 5, when the first positive initialization signal INT1 transitions to a level of logic low and the first negative initialization signal INTB1 transitions to a level of logic high, the first clock generation circuit 1020 illustrated in FIG. 10 may perform the oscillation operation. That is, the first clock generation circuit 1020 may generate the first phase clock signal M_CLK1 and the second phase clock signal M_CLK2 having phase difference corresponding to an amount of 90 degrees.

Referring to FIG. 11, the second initialization signals INT2 and INTB2 may include a second positive initialization signal INT2 and a second negative initialization signal INTB2. Therefore, the second positive initialization signal INT2 and the second negative initialization signal INTB2 may transition based on the falling edge, at which the pulse of the control pulse signal CTR ends. That is, based on the falling edge of the control pulse signal CTR, the second positive initialization signal INT2 may transition from a level of logic high to a level of logic low and the second negative initialization signal INTB2 may transition from a level of logic low to a level of logic high. In the similar way of the first clock generation circuit 1020, the second clock generation circuit 1030 may generate the third phase clock signal M_CLK3 and the fourth phase clock signal M_CLK4 having phase difference corresponding to an amount of 90 degrees through the oscillation operation.

As described above, the time point when the first initialization signals INT1 and INTB1 transition and the time point when the second initialization signals INT2 and INTB2 transition may have a phase difference corresponding to an amount of 180 degrees with respect to the first phase clock signal M_CLK1. Therefore, the first phase clock signal M_CLK1 generated on the basis of the first initialization signals INT1 and INTB1 and the third phase clock signal M_CLK3 generated on the basis of the second initialization signals INT2 and INTB2 may have a phase difference corresponding to an amount of 180 degrees.

To sum up, the clock generation circuit 1000 may generate the first initialization signals INT1 and INTB1 and the second initialization signals INT2 and INTB2 based on the control pulse signal CTR corresponding to the target phase clock signal, e.g., the first phase clock signal M_CLK1. Based on the first initialization signals INT1 and INTB1, the first clock generation circuit 1020 may generate the first phase clock signal M_CLK1 and the second phase clock signal M_CLK2 having a phase difference corresponding to an amount of 90 degrees. Based on the second initialization signals INT2 and INTB2, the second clock generation circuit 1030 may generate the third phase clock signal M_CLK3 and the fourth phase clock signal M_CLK4 having a phase difference corresponding to an amount of 90 degrees.

In accordance with an embodiment of the present disclosure, the clock generation circuit 1000 may generate the first to fourth phase clock signals M_CLK1, M_CLK2, M_CLK3 and M_CLK4 respectively having a phase difference corresponding to an amount of 90 degrees through the synchronization structure.

In accordance with an embodiment of the present disclosure, the multi-phase clock signals may be generated through the synchronization structure and thus the variation of PVT may hardly have an influence on the multi-phase clock signals, which increases reliability of the multi-phase clock signals.

In accordance with an embodiment of the present disclosure, an internal voltage may be generated through stable multi-phase clock signals, which increases stability of the internal voltage.

While certain embodiments have been described above, it will be understood to those skilled in the art that the embodiments described are by way of example only. Accordingly, the clock generation circuit and voltage generation circuit including the same should not be limited based on the described embodiments. Rather, the clock generation circuit and voltage generation circuit including the same described herein should only be limited in light of the claims that follow when taken in conjunction with the above description and accompanying drawings.

What is claimed is:

1. A clock generation circuit comprising:
a control clock generation circuit comparing a voltage level of a reference voltage with each voltage level of a first feedback clock signal and a second feedback clock signal to generate a first control clock signal and a second control clock signal;
a first clock synchronization circuit making the first feedback clock signal and the second feedback clock signal transit in synchronization with the first control clock signal and the second control clock signal, wherein the first clock synchronization circuit is configured to generate each of the first feedback clock signal and the second feedback clock signal based on both of the first control clock signal and the second control clock signal; and
a second clock synchronization circuit generating a first phase clock signal and a second phase clock signal in synchronization with a time point when each of the first feedback clock signal and the second feedback clock signal transitions.

2. The clock generation circuit of claim 1, wherein the control clock generation circuit includes:
a first control clock generation circuit comparing voltage levels of the first feedback clock signal and the reference voltage to generate the first control clock signal; and
a second control clock generation circuit comparing voltage levels of the second feedback clock signal and the reference voltage to generate the second control clock signal.

3. The clock generation circuit of claim 2, wherein each of the first control clock generation circuit and the second control clock generation circuit includes:
an input circuit receiving, buffering, and outputting a corresponding one of the first feedback clock signal and the second feedback clock signal; and
a comparison circuit comparing voltage levels of the reference voltage and an output signal of the input circuit to output a corresponding one of the first control clock signal and the second control clock signal.

4. The clock generation circuit of claim 1, wherein the first clock synchronization circuit includes:
a latching circuit performing a set operation based on the first control clock signal and performing a reset operation based on the second control clock signal; and
an initialization circuit initializing the latching circuit based on an initialization signal.

5. The clock generation circuit of claim 1, wherein the second clock synchronization circuit includes:
a first dividing circuit receiving and dividing the first feedback clock signal to generate the first phase clock signal; and
a second dividing circuit receiving and dividing the second feedback clock signal to generate the second phase clock signal.

\* \* \* \* \*